(12) United States Patent
Herr et al.

(10) Patent No.: US 7,264,481 B2
(45) Date of Patent: Sep. 4, 2007

(54) PRESSURE CONTRACT SPRING FOR CONTACT ARRANGEMENT IN POWER SEMICONDUCTOR MODULE

(75) Inventors: Egon Herr, Zürich (CH); Jerôme Assal, Zürich (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 10/567,787

(22) PCT Filed: Aug. 22, 2003

(86) PCT No.: PCT/CH03/00569

§ 371 (c)(1),
(2), (4) Date: Feb. 9, 2006

(87) PCT Pub. No.: WO2005/020383

PCT Pub. Date: Mar. 3, 2005

(65) Prior Publication Data
US 2006/0240685 A1 Oct. 26, 2006

(51) Int. Cl.
*H01R 12/00* (2006.01)
(52) U.S. Cl. .................. 439/66; 439/591; 439/700; 439/824
(58) Field of Classification Search ............ 439/66, 439/591, 862, 700, 824
See application file for complete search history.

(56) References Cited
U.S. PATENT DOCUMENTS

| | | | |
|---|---|---|---|
| 4,012,094 A | 3/1977 | VanRenssen et al. | |
| 4,161,346 A * | 7/1979 | Cherian et al. | 439/66 |
| 4,505,529 A * | 3/1985 | Barkus | 439/82 |
| 4,623,207 A | 11/1986 | Sasaki et al. | |
| 5,069,627 A * | 12/1991 | Buck et al. | 439/66 |
| 5,546,280 A | 8/1996 | Hasebe et al. | |
| 5,904,580 A * | 5/1999 | Kozel et al. | 439/66 |
| 6,246,247 B1 | 6/2001 | Eldridge et al. | |
| 6,343,940 B1 | 2/2002 | Khoury et al. | |
| 6,572,386 B1 * | 6/2003 | Howell et al. | 439/66 |
| 6,579,804 B1 | 6/2003 | Zhou et al. | |
| 6,764,315 B2 * | 7/2004 | Ng et al. | 439/66 |
| 2004/0102063 A1 * | 5/2004 | Yin et al. | 439/66 |
| 2005/0250354 A1 * | 11/2005 | Vinther | 439/66 |

FOREIGN PATENT DOCUMENTS

| | | |
|---|---|---|
| DE | 1 276 158 | 8/1968 |
| JP | 61150249 | 7/1986 |

OTHER PUBLICATIONS

C. Göbl et al., SKiiP 3SEMIKRON Elektronik GmbH, (www.semikron.com/jahr2000/pcimskiip3.pdf-downloaded), Aug. 11, 2002, pp. 1-6.

* cited by examiner

*Primary Examiner*—Tho D. Ta
(74) *Attorney, Agent, or Firm*—Buchanan Ingersoll & Rooney PC.

(57) ABSTRACT

The pressure contact spring (3) according to the invention comprises two contacting regions (31, 32) for contacting metallized contact pads (1, 2), one contacting region comprising a contact tip (31). Arranged between the contacting regions is a compressing region (33). The contact tip is rounded with an outer radius.

The rounded contact tip penetrates only little into the metallization of the contact pad even under high spring force.

13 Claims, 3 Drawing Sheets

PRESSURE CONTRACT SPRING FOR CONTACT ARRANGEMENT IN POWER SEMICONDUCTOR MODULE

This disclosure claims priority under 35 U.S.C. §371 to International Application No. PCT/CH2003/000569, filed Aug. 22, 2003, the contents of which are incorporated herein by reference.

TECHNICAL FIELD

The invention relates to the field of power electronics, in particular to the field of power semiconductor modules.

The invention relates to an electrical pressure contact spring according to the precharacterizing clause of patent claim 1, an electrical contact arrangement and a power semiconductor module.

PRIOR ART

In today's power semiconductor modules, bonding wires are usually used for the contacting of semiconductor control electrodes, for example gate electrodes of insulated gate bipolar transistors (IGBTs). The bonding wires are in this case usually welded by ultrasound onto the metallization of the semiconductors.

To protect from dust and moisture and neatly insulate electrodes of the power semiconductors, the semiconductor and the bonding wire are typically embedded in a soft, electrically insulating silicone gel.

Such a system is disclosed in C. Göbl et al., "SkiiP 3", SEMIKRON Elektronik GmbH, (www.semikron.com/jahr2000/pcimskiip3.pdf). FIG. 4 shows a semiconductor module with a semiconductor chip, which is contacted by means of a bonding wire. The bonding wire is attached on the substrate and connected to the control circuit by means of a contact spring.

An alternative technology, which however is only used in hermetic enclosures without silicone gel, is that of contacting the control electrodes by means of a pressure contact spring. In this case, a contact pin with a conical or cylindrical spring is pressed onto the control electrode. The spring exerts a small spring force, of for example 1 N. On account of the small spring force, the contact pin will penetrate only little into the metallization of the electrode, just enough to ensure reliable contact between the contact pin and the control electrode.

When such spring pins are used in modules filled with silicone gel, the problem arises that either the springs become clogged with the viscous gel, and so are hindered in their movement, or that under certain operating conditions the contact pin cannot establish reliable contact with the control electrode on account of the viscous gel.

In order to improve the reliability of contact, it is possible for example to increase the spring force or to sharpen the tip of the contact pin. As a result, the contact pin penetrates deeper into the metallization of the electrodes and will provide adequate connection even when the contact spring is subjected to relatively forcible mechanical effects of the gel. However, with increased spring force there is the risk of the pointed contact pin penetrating through the metallization and damaging the electrode under it.

BRIEF SUMMARY OF THE INVENTION

The object of the invention is consequently that of providing an electrical pressure contact spring of the type mentioned at the beginning with which improved contacting is ensured under all operating conditions.

This object is achieved by an electrical pressure contact spring with the features of the independent claim 1.

The pressure contact spring according to the invention comprises two contacting regions for contacting electrically conductive contact pads, one of the two contacting regions comprising a contact tip. Arranged between the contacting regions is a compressing region with at least one wire curvature. A straight portion of wire extending from the compressing region and finishing in the contact tip runs in the direction of the spring force. The contact tip of the pressure contact spring according to the invention is rounded with an outer radius, the outer radius corresponding to one to three times the thickness of the wire.

By means of the straight portion of wire between the compressing region and the contact tip, the contact tip of the pressure contact spring according to the invention is pressed against the contact pin with the entire spring force that is acting in the direction of the wire. Even under high spring force, the rounded contact tip penetrates only little into the metallization of the contact pad.

The rounded contact tip can be created in a simple way by bending the wire in the contacting region. As a result, the contact-tip does not have to be laboriously machined and precision-polished.

In one embodiment, the pressure contact spring according to the invention has a rectangular cross section with a thickness and a depth. The pressure contact spring is bent exclusively in a plane perpendicular to the depth. This achieves the effect that the pressure spring bends only in this one plane when it is pressed together.

In one embodiment, the pressure contact spring according to the invention is used in an electrical contact arrangement. It serves as an electrically conductive connection between two electrically conductive contact pads of the contact arrangement that are arranged opposite each other.

The contact pads are formed in such a way that they prevent the contact tip from penetrating too deeply. For example, they have a hardness of from 45 to 70 Hv, in the case of a pressure contact spring according to the invention with a correspondingly rounded contact tip and a spring force of between 4 and 10 N.

In order to prevent the contact tip of the pressure contact spring from penetrating too deeply into a contact pad of the contact arrangement under increased spring pressure, the electrically conductive contact pad has a barrier layer, which is arranged underneath the surface layer and consists of a material that is harder than the material of this surface layer. The surface layer may therefore comprise a very soft material, which ensures a reliable connection with respect to the contact tip of the pressure contact spring.

The barrier layer preferably has clearances which are filled with the softer, electrically conductive material of the surface layer.

In one embodiment, the contact arrangement with the pressure contact spring according to the invention is used in a power semiconductor module. In this case, an electrode metallization of a power semiconductor chip is the contact pad of the contact arrangement that is contacted by the contact tip. The second contact pad is a terminal led out from the module.

The power semiconductor module with the contact arrangement with the pressure contact spring according to the invention is filled with an electrically insulating gel. Thanks to the pressure contact spring according to the invention, a reliable contact between the terminal led out from the module and the electrode of the power semiconductor chip is ensured. The pressure spring can be subjected to an increased spring force without the contact tip of the pressure contact spring penetrating through the metallization of the power semiconductor electrode.

BRIEF DESCRIPTION OF THE DRAWINGS

Preferred embodiments of the invention are explained below on the basis of drawings, in which.

WAY OF IMPLEMENTING THE INVENTION

In the figures, parts acting in the same way are provided with the same designations.

Figure 1:
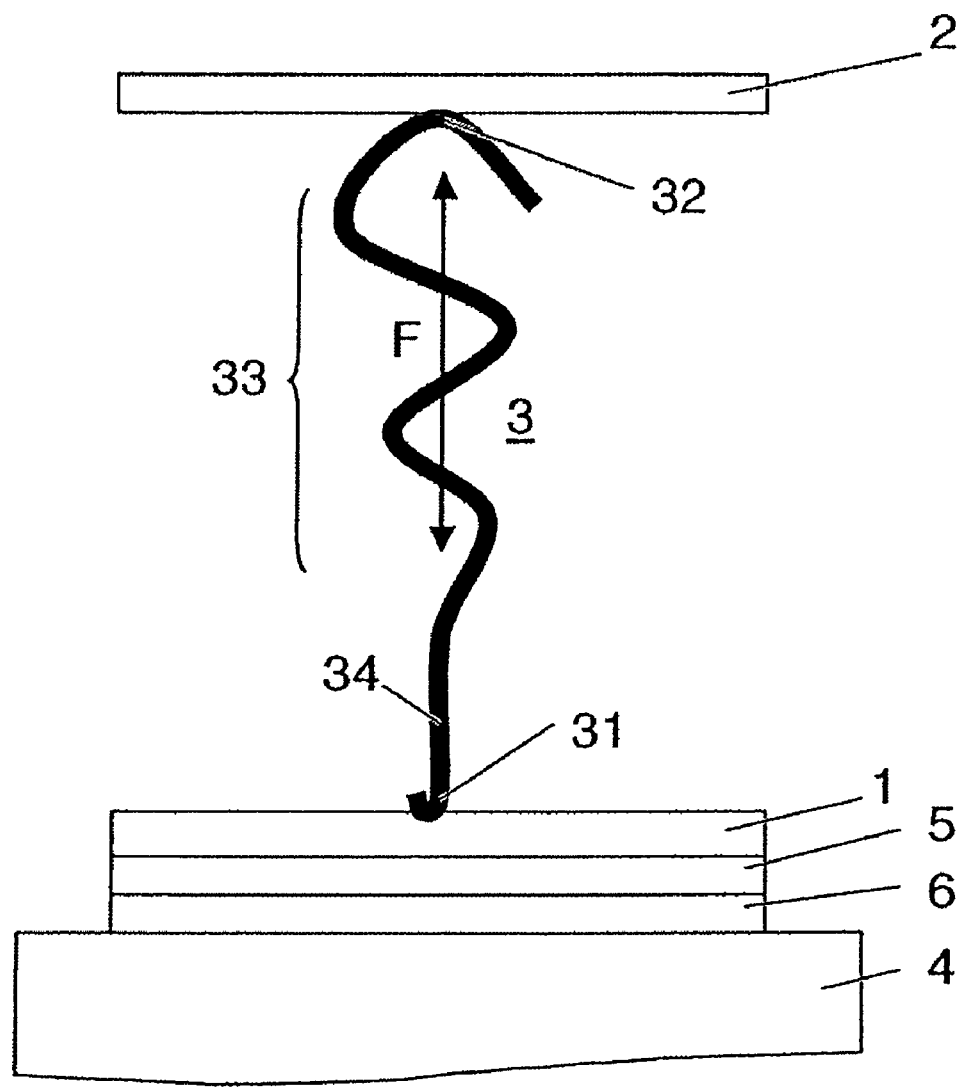
FIG. 1 shows a schematic representation of a contact arrangement with a pressure contact spring according to the invention.

FIG. 1 schematically shows a contact arrangement of a power semiconductor module with the pressure contact spring 3 according to the invention. The pressure contact spring is clamped as an electrically conductive connection between two electrically conductive contact pads 1 and 2 arranged opposite each other. The contact pad 1 is the metallization of the control electrode of the power semiconductor. The schematically represented electrode 5 is separated from the power semiconductor 4 by an insulating layer 6. The contact pad 2 is a control terminal which is led out from the module and comprises, for example, a printed circuit board which is arranged on the inner side of a housing cover of the module.

The pressure contact spring according to the invention is produced from a 0.2-0.6 mm thick, electrically conductive wire, for example a metal wire made of copper or a copper and beryllium compound. The wire is formed into a spring and, if appropriate, thermally hardened. Subsequently, the spring is subjected to a trowal process in order to round the edges before the coating is applied in a final working step. The coating must have good electrical conduction and must not oxidize on contact with air or corrode or chemically react on contact with metal surfaces. Typically, the spring is coated with a presious metal, for example with gold. The pressure contact spring has in the uncompressed state a length of between 5 and 15 mm.

The pressure contact spring according to the invention comprises two contacting regions 31 and 32 for contacting the contact pads 1 and 2 of the contact arrangement. Between the two contacting regions there is a compressible spring region 33, which comprises at least one wire bend. The first contacting region 31 is formed into a tip, while in the embodiment represented the second contacting region 32 comprises a wire bend.

Between the compressing region 33 and the contact tip 31, the pressure contact spring is formed as a straight piece of wire 34, which runs in the direction of the spring force F exerted by the compressing region.

The contact tip, which is arranged at one end of the straight piece of wire 34, is pressed by the spring force F perpendicularly against the contact pad 1. This produces a defined contact point, which thanks to the great local pressure cannot be displaced very easily on the contact pad.

The wire bend of the second contacting region 32 has at the contact point a greater bearing surface, and consequently a lower relative pressing pressure. The wire bend does not bear against the second contact pad 2 with a fixedly defined point, but is movable, depending on how strongly the pressure contact spring is pressed together by mechanical and/or thermal pressure. If the pressure contact spring is used in a contact arrangement in which a gel is introduced only into the region of the first contact pad, the second contacting region may be formed as a wire bend, as in the embodiment represented. Should the entire contact arrangement, and in particular the regions of the two contact pads, be filled with gel, the second contacting region may also be provided with a contact tip, in order to ensure good contact also in the region of the second contact pad.

In a pressure contact, the contact area $A_b$ of the two contact elements is given by $A_b=F/H_v$, where F as the contact force and $H_v$ is the hardness of the softer contact element.

In the contact arrangement described, the form of the contact spring 31 of the pressure contact spring 3 together with the spring force F and the hardness $H_v$ of the surface of the contact pad 1 consequently determine the depth of penetration of the contact tip into the metallization 11 of the contact pad. In order to achieve the desired maximum depth of penetration for a given spring force and hardness of the metallization 11, the contact tip 31 is rounded with an outer radius which, in the actual contact region between the contact tip 31 and the metallization 11, corresponds to one to three times the thickness of the wire of the pressure contact spring.

When contacting the contact pad by the contact tip, the contact area is at first small, which makes it possible for the contact tip to penetrate into the contact pad. As soon as the contact tip has penetrated a little into the contact pad, the contact area increases in size. The contact area that rapidly increases in size as the depth of penetration increases provides increasing mechanical contact resistance. Unlike in the case of conventional, pointed contact tips, the contact area and the corresponding mechanical contact resistance increase very quickly even with a very small depth of penetration. Choosing an appropriate radius of the rounding of the contact tip allows the desired maximum depth of penetration to be fixed for a given spring force, hardness and density of the metallization, for example to half the thickness of the metallization.

Figure 2:
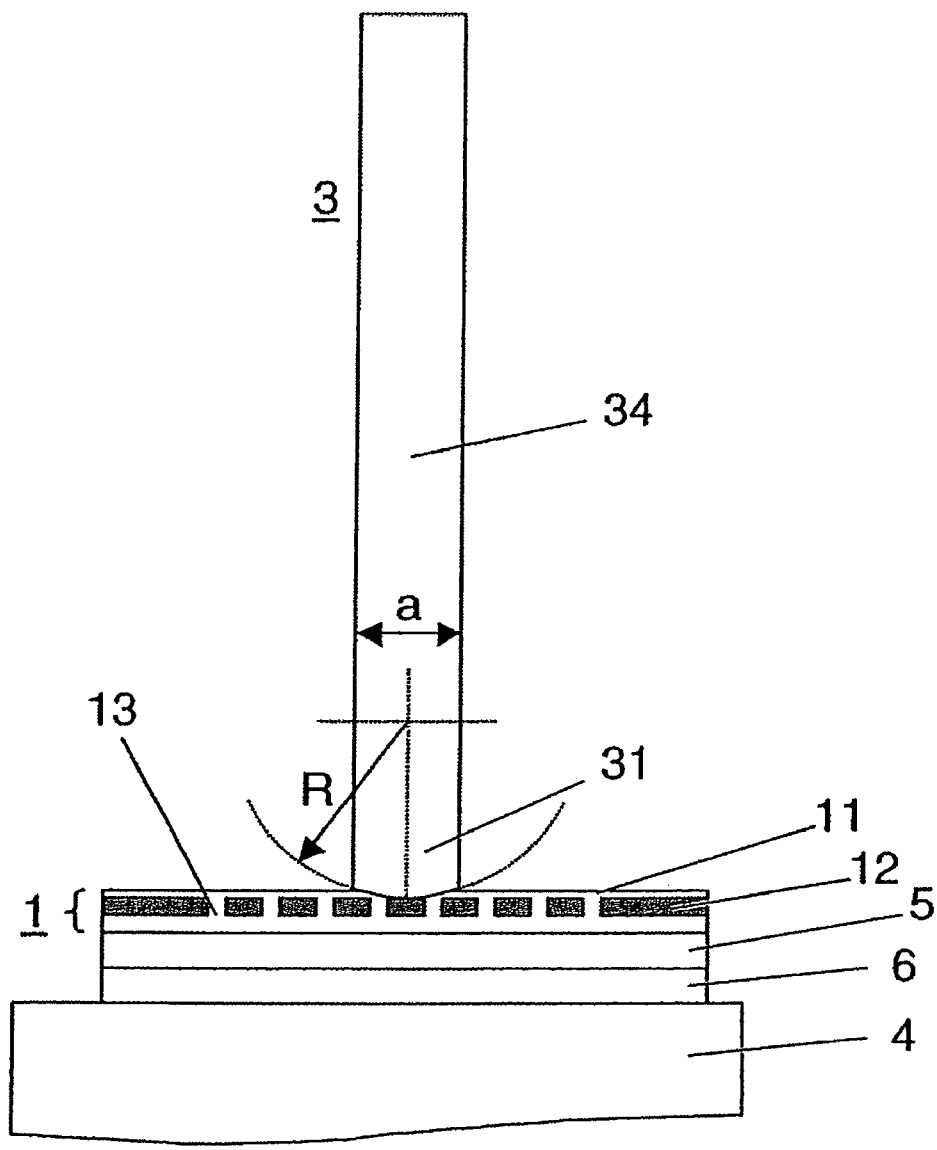
FIG. 2 shows a contact arrangement as shown in FIG. 1, with a first embodiment of the pressure contact spring according to the invention.

FIG. 2 shows a first embodiment of the contact tip 31 of the pressure contact spring according to the invention. The straight piece of wire 34 ends in a rounded tip 31. The contact tip has an outer radius R which is around twice as great as the thickness a of the wire.

The rounding may be cylindrical, for example symmetrical with respect to a perpendicular to the direction of the wire, or spherical, i.e. circular-symmetrical with respect to the center point of the contact tip.

In order additionally to limit the maximum depth of penetration, in the embodiment of the contact arrangement represented in FIG. 2 a barrier layer 12 is provided in the metallization of the contact pin 11. The barrier layer is provided underneath the surface of the metallization. It comprises a material which is harder than the material of the metallization in the region of the surface, for example silicon nitride. The barrier layer may also consist of a hard electrically conductive material. The metallization 11 of the contact pad encloses the barrier layer 12. The surface layer serves for the contacting by the pressure contact spring, while a metal layer arranged underneath the barrier layer serves for example for the contacting of a polysilicon electrode lying under it. In order to ensure an optimum electrical connection of these two metallization layers, clearances which are filled with the material of the metallization layers are provided in the barrier layer.

Figure 3:
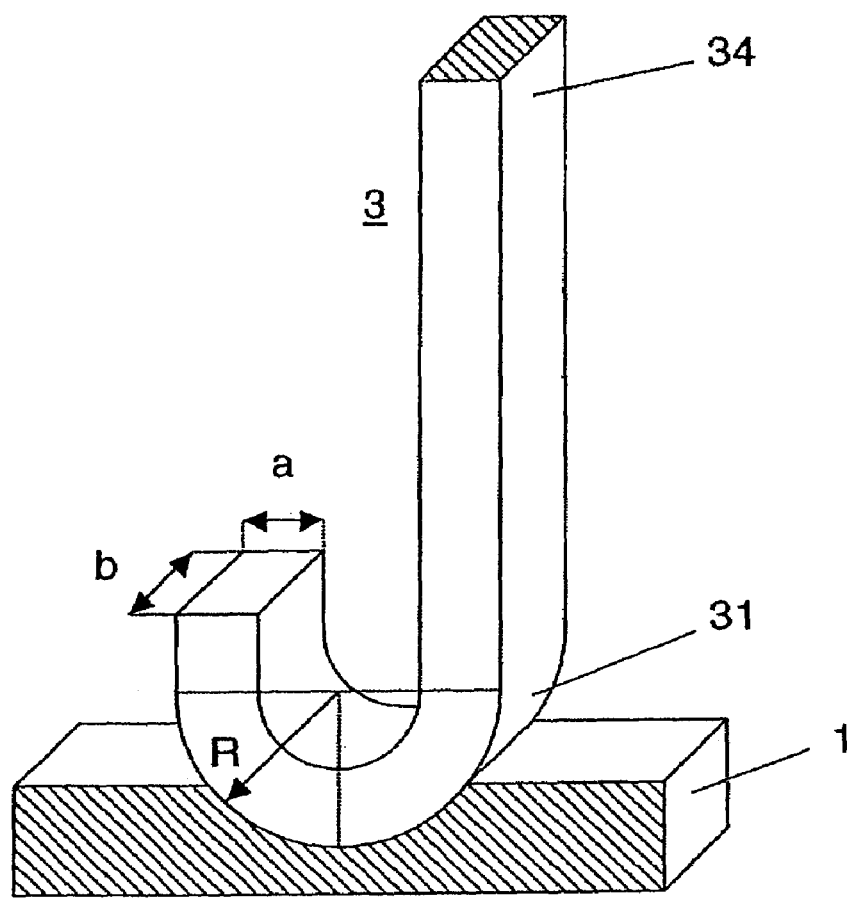
FIG. 3 shows the contact arrangement as shown in FIG. 1, with a second embodiment of the pressure contact spring according to the invention.

FIG. 3 shows a further embodiment of the contact tip 31 of the pressure contact spring 3 according to the invention. The contact tip is likewise rounded and has an outer radius of around 2.5 times the thickness of the wire. However, the rounding is formed by a small wire bend at the end of the straight piece of wire 34. This contact tip can be formed with the desired radius simply by bending the wire, without laborious cutting and polishing operations. Since the outer radius of the wire bend is of the order of magnitude of half a millimeter, the spring force at the actual contact point acts substantially in the direction of the straight piece of wire 34.

The wire used for the pressure spring may have a round cross section or, as represented in FIG. 3, a rectangular cross section with the thickness a and the depth b. Typical values are approximately a=0.3 mm and b=0.6 mm. The pressure contact spring is bent in a plane perpendicular to the depth of the wire. This stabilizes the spring and provides the desired pressure in the direction perpendicular to the plane of the contact pad 1. A piece of wire that is bent three-dimensionally, for example spirally, in particular in the compressing region 33, would be impaired more in its freedom of movement by silicone gel introduced into the intermediate space between the semiconductor chip and the housing cover. The two-dimensionally bent piece of wire is therefore the preferred embodiment.

Figure 4:
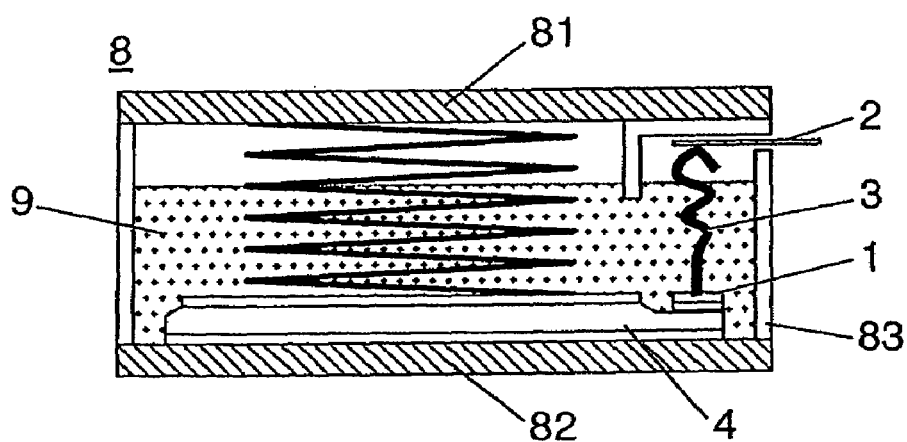
FIG. 4 shows a schematic representation of a power semiconductor module with the contact arrangement as shown in FIG. 1.

FIG. 4 schematically shows the power semiconductor module 8 with the contact pad with the pressure contact spring 3 according to the invention. The module comprises a housing 83 and also electrically conductive top and bottom plates 81 and 82, which serve as power terminals for the power semiconductor 4. The pressure contact spring 3 is arranged in the region of the control electrode of the power semiconductor, between the metallization 1 of the control electrode and a control terminal 2 led out from the module. The module is filled with an electrically insulating silicone gel in the region of the power semiconductor, in particular in the region of the upper power electrode and the control electrode. As a result, the power electrode and the control electrode are neatly electrically insulated.

| List of designations | |
|---|---|
| 1 | First contact pad, electrode metallization |
| 11 | Surface layer |
| 12 | Barrier layer |
| 13 | Clearances |
| 2 | Second contact pad |
| 3 | Pressure contact spring |
| 31, 32 | Contacting region |
| 33 | Compressing region |
| 34 | Straight piece of wire |
| 4 | Power semiconductor chip |
| 5 | Control electrode |
| 6 | Insulating layer |
| 8 | Power semiconductor module |
| 81, 82 | Power terminals |
| 83 | Module housing |

The invention claimed is:

1. An electrical contact arrangement, comprising
a first electrically conductive contact pad,
a second electrically conductive contact pad, and
an electrically conductive connection between the first and second contact pads, the two contact pads being arranged opposite each other and the connection being an electrical pressure contact spring clamped of electrically conductive wire between the two contact pads, the electrical pressure contact spring comprising
a first contacting region for contacting the first electrically conductive contact pad, a rounded contact tip being arranged in the first contacting region for contacting the first contact pad,
the contact tip having an outer radius (R) which corresponds to one to three times the thickness of the wire (a),
a second contacting region for contacting the second electrically conductive contact pad, and
a compressing region, with at least one wire curvature, arranged between the first contacting region and the second contacting region, a straight piece of wire extending from the compressing region and finishing in the contact tip running in the direction of the spring force (F), wherein
the wire is bent in the first contacting region, and wherein this wire bend forms the contact tip,
wherein at least the first contact pad includes a barrier layer arranged underneath a surface layer such that the contact tip of the pressure contact spring is prevented from penetrating through the barrier layer when it penetrates into said surface layer.

2. An electrical contact arrangement, comprising
a first electrically conductive contact pad,
a second electrically conductive contact pad, and
an electrically conductive connection between the first and second contact pads, the two contact pads being arranged opposite each other and the connection being an electrical pressure contact spring clamped of electrically conductive wire between the two contact pads, the electrical pressure contact spring comprising
a first contacting region for contacting the first electrically conductive contact pad, a rounded contact tip being arranged in the first contacting region for contacting the first contact pad,
the contact tip having an outer radius (R) which corresponds to one to three times the thickness of the wire (a),
a second contacting region for contacting the second electrically conductive contact pad, and
a compressing region, with at least one wire curvature, arranged between the first contacting region and the second contacting region, a straight piece of wire extending from the compressing region and finishing in the contact tip running in the direction of the spring force (F), wherein
the wire is bent in the first contacting region, and wherein this wire bend forms the contact tip,
wherein the contact arrangement comprises means by which the contact tip of the pressure contact spring is prevented from penetrating through the first contact pad when it penetrates into said first contact pad, and wherein the means comprise a multilayered first contact pad, a barrier layer which consists of a harder material than the material of a surface layer, the barrier layer being arranged under said surface layer.

3. The contact arrangement as claimed in claim 2, wherein the barrier layer has clearances which are filled with the material of the surface layer.

4. A power semiconductor module, comprising
at least one power semiconductor chip with at least one electrode with a metallization, and
at least one electrical contact arrangement, the electrical contact arrangement comprising
a first electrically conductive contact pad,
a second electrically conductive contact pad, and
an electrically conductive connection between the first and second contact pads, the two contact pads being arranged opposite each other, the electrode metallization being the first contact pad of the contact arrangement and a terminal led out from the module being the second contact pad of the contact arrangement, and the connection being an electrical pressure contact spring clamped of electrically conductive wire between the two contact pads, the electrical pressure contact spring comprising
a first contacting region for contacting the first electrically conductive contact pad, a rounded contact tip being arranged in the first contacting region for contacting the first contact pad,
the contact tip having an outer radius (R) which corresponds to one to three times the thickness of the wire (a),
a second contacting region for contacting the second electrically conductive contact pad, and
a compressing region, with at least one wire curvature, arranged between the first contacting region and the second contacting region, a straight piece of wire extending from the compressing region and finishing in the contact tip running in the direction of the spring force (F), wherein
the wire is bent in the first contacting region, and wherein this wire bend forms the contact tip.

5. The power semiconductor module as claimed in claim 4, wherein
the power semiconductor module is filled with an electrically insulating gel in the region between the first and second contact pads.

6. A power semiconductor module, comprising
at least one power semiconductor chip with at least one electrode with a metallization, and
at least one electrical contact arrangement, the electrical contact arrangement comprising
a first electrically conductive contact pad,
a second electrically conductive contact pad, and
an electrically conductive connection between the first and second contact pads, the two contact pads being arranged opposite each other, the electrode metallization being the first contact pad of the contact arrangement and a terminal led out from the module being the second contact pad of the contact arrangement, and the connection being an electrical pressure contact spring clamped of electrically conductive wire between the two contact pads, the first contact pad having a hardness of from 45 to 70 Hv, and the spring force (F) lying between 4 and 12 N, the electrical pressure contact spring comprising
a first contacting region for contacting the first electrically conductive contact pad, a rounded contact tip being arranged in the first contacting region for contacting the first contact pad,
the contact tip having an outer radius (R) which corresponds to one to three times the thickness of the wire (a),
a second contacting region for contacting the second electrically conductive contact pad, and
a compressing region, with at least one wire curvature, arranged between the first contacting region and the second contacting region, a straight piece of wire extending from the compressing region and finishing in the contact tip running in the direction of the spring force (F), wherein
the wire is bent in the first contacting region, and wherein this wire bend forms the contact tip.

7. The power semiconductor module as claimed in claim 6, wherein
the wire of the pressure contact spring has a rectangular cross section with a thickness (a) and a depth (b), and
the spring is bent in a plane perpendicular to the depth (b).

8. The power semiconductor module as claimed in claim 7, wherein the two contact pads of the electrical contact arrangement are arranged opposite each other, the contact spring being clamped between the two contact pads.

9. A power semiconductor module, comprising
at least one power semiconductor chip with at least one electrode with a metallization, and
at least one electrical contact arrangement, the electrical contact arrangement comprising
a first electrically conductive contact pad,
a second electrically conductive contact pad, and
an electrically conductive connection between the first and second contact pads, the two contact pads being arranged opposite each other, the electrode metallization being the first contact pad of the contact arrangement and a terminal led out from the module being the second contact pad of the contact arrangement, and the connection being an electrical pressure contact spring clamped of electrically conductive wire between the two contact pads, the electrical pressure contact spring comprising
a first contacting region for contacting the first electrically conductive contact pad, a rounded contact tip being arranged in the first contacting region for contacting the first contact pad,
the contact tip having an outer radius (R) which corresponds to one to three times the thickness of the wire (a),
a second contacting region for contacting the second electrically conductive contact pad, and
a compressing region, with at least one wire curvature, arranged between the first contacting region and the second contacting region, a straight piece of wire extending from the compressing region and finishing in the contact tip running in the direction of the spring force (F), wherein
the wire is bent in the first contacting region, and wherein this wire bend forms the contact tip,
wherein the contact arrangement comprises means by which the contact tip of the pressure contact spring is prevented from penetrating through the first contact pad when it penetrates into said first contact pad.

10. The power semiconductor module as claimed in claim 9, wherein
the wire of the pressure contact spring has a rectangular cross section with a thickness (a) and a depth (b), and
the spring is bent in a plane perpendicular to the depth (b).

11. The power semiconductor module as claimed in claim 10, wherein the two contact pads of the electrical contact arrangement are arranged opposite each other, the contact spring being clamped between the two contact pads.

12. A power semiconductor module, comprising
at least one power semiconductor chip with at least one electrode with a metallization, and
at least one electrical contact arrangement, the electrical contact arrangement comprising
a first electrically conductive contact pad,
a second electrically conductive contact pad, and
an electrically conductive connection between the first and second contact pads, the two contact pads being arranged opposite each other, the electrode metallization being the first contact pad of the contact arrangement and a terminal led out from the module being the second contact pad of the contact arrangement, and the connection being an electrical pressure contact spring clamped of electrically conductive wire between the two contact pads, the electrical pressure contact spring comprising
a first contacting region for contacting the first electrically conductive contact pad, a rounded contact tip being arranged in the first contacting region for contacting the first contact pad,
the contact tip having an outer radius (R) which corresponds to one to three times the thickness of the wire (a),
a second contacting region for contacting the second electrically conductive contact pad, and
a compressing region, with at least one wire curvature, arranged between the first contacting region and the second contacting region, a straight piece of wire extending from the compressing region and finishing in the contact tip running in the direction of the spring force (F), wherein
the wire is bent in the first contacting region, and wherein this wire bend forms the contact tip,
wherein the contact arrangement comprises means by which the contact tip of the pressure contact spring is prevented from penetrating through the first contact pad when it penetrates into said first contact pad, and wherein the means comprise a multilayered first contact pad, a barrier layer which consists of a harder material than the material of a surface layer, the barrier layer being arranged under said surface layer.

13. A power semiconductor module, comprising
at least one power semiconductor chip with at least one electrode with a metallization, and
at least one electrical contact arrangement, the electrical contact arrangement comprising
a first electrically conductive contact pad,
a second electrically conductive contact pad, and
an electrically conductive connection between the first and second contact pads, the two contact pads being arranged opposite each other, the electrode metallization being the first contact pad of the contact arrangement and a terminal led out from the module being the second contact pad of the contact arrangement, and the connection being an electrical pressure contact spring clamped of electrically conductive wire between the two contact pads, the electrical pressure contact spring comprising
a first contacting region for contacting the first electrically conductive contact pad, a rounded contact tip being arranged in the first contacting region for contacting the first contact pad,
the contact tip having an outer radius (R) which corresponds to one to three times the thickness of the wire (a),
a second contacting region for contacting the second electrically conductive contact pad, and
a compressing region, with at least one wire curvature, arranged between the first contacting region and the second contacting region, a straight piece of wire extending from the compressing region and finishing in the contact tip running in the direction of the spring force (F), wherein
the wire is bent in the first contacting region, and wherein this wire bend forms the contact tip,
wherein the contact arrangement comprises means by which the contact tip of the pressure contact spring is prevented from penetrating through the first contact pad when it penetrates into said first contact pad, wherein the means comprise a multilayered first contact pad, a barrier layer which consists of a harder material than the material of a surface layer, the barrier layer being arranged under said surface layer, and wherein the barrier layer has clearances which are filled with the material of the surface layer.

* * * * *